United States Patent
Mizuno

[11] Patent Number: 5,563,554
[45] Date of Patent: Oct. 8, 1996

[54] VOLTAGE CONTROLLED OSCILLATOR AND PHASE-LOCKED LOOP CIRCUIT

[75] Inventor: Masayuki Mizuno, Tokyo, Japan

[73] Assignee: NEC Corporation, Tokyo, Japan

[21] Appl. No.: 524,415

[22] Filed: Sep. 6, 1995

[30] Foreign Application Priority Data

Sep. 6, 1994 [JP] Japan ................................. 6-211640

[51] Int. Cl.⁶ ............................. H03B 5/24; H03L 7/081; H03L 7/083; H03L 7/099
[52] U.S. Cl. ............................. 331/57; 331/2; 331/8; 331/25; 331/34; 331/46; 331/55; 331/172; 331/177 R; 331/175; 327/122; 327/158
[58] Field of Search ............................. 331/1 A, 2, 8, 331/25, 34, 46–48, 55, 57, 143, 153, 172, 173, 175, 177 R; 327/105, 107, 116, 119, 120, 122, 156–159, 270; 375/376; 455/260

[56] References Cited

U.S. PATENT DOCUMENTS

| | | | |
|---|---|---|---|
| 4,922,141 | 5/1990 | Lofgren et al. | 327/158 |
| 5,347,234 | 9/1994 | Gersbach et al. | 331/57 |
| 5,349,311 | 9/1994 | Mentzer | 331/57 |
| 5,357,217 | 10/1994 | Marchesi et al. | 331/57 |
| 5,416,444 | 5/1995 | Yamauchi et al. | 331/57 X |
| 5,428,309 | 6/1995 | Yamauchi et al. | 327/158 |

OTHER PUBLICATIONS

Pp. 309 and 310 of "Electronics Letters, 14th Feb. 1991, vol. 27, No. 4," Buchwald, A. W. et al High–Speed Voltage––Controlled Oscillator With Quadrature Outputs.

*Primary Examiner*—David Mis

[57] ABSTRACT

The voltage-controlled oscillator according to the invention has a plurality of first amplifier elements 100 and a plurality of phase correctors 101. Each of the first amplifier element 100 is provided with a pair of input signal lines, a pair of output signal lines and one or more control signal line 104 and can function as a differential amplifier and control the delay time for which a differential signal is transmitted from the pair of input signal lines to the pair of output signal lines by the control signal of the control signal line 104.

8 Claims, 9 Drawing Sheets

VOLTAGE CONTROLLED OSCILLATOR AND PHASE-LOCKED LOOP CIRCUIT

FIELD OF THE INVENTION

This invention relates to a voltage-controlled oscillator, and more particularly to, a voltage-controlled oscillator providing a doubled frequency output, and relates to a phase-locked loop circuit employing the same.

BACKGROUND OF THE INVENTION

A conventional voltage-controlled oscillator comprises a voltage-controlled variable delay unit which can control the delay time for which a differential signal is transmitted from a pair of reference input signal lines to a pair of reference output signal lines by a control signal, the voltage-controlled variable delay unit comprising a plurality of amplifier elements with which a pair of input signal lines, a pair of output signal lines and one or more control signal line are provided, the plurality of amplifier elements are linearly connected to connect the pair of input signal lines and the pair of output signal lines; and exclusive OR circuits to obtain a doubled signal by utilizing a phase difference of signals obtained from the respective pair of output signal lines from the voltage-controlled variable delay unit, wherein the voltage-controlled variable delay units and the exclusive OR circuits are connected in the form of a pyramid by means of the pairs of output signal lines.

In the conventional voltage-controlled oscillator, when the control signal line is controlled such that the phase difference between the periodic signal inputted to the pair of reference input signal lines and the periodic signal outputted from the pair of reference output signal lines is 180 degrees, the periodic signal with a quadrupled frequency of 4×f(if the frequency of the periodic signal is f) is obtained from the pair of output signal lines.

However, since the dispersion in the quality of the amplifier element or exclusive OR circuit directly affects the jitter in the doubled signal obtained from the pair of output signal lines, the doubled or quadrupled signal therefrom trends to include a considerable jitter.

SUMMARY OF THE INVENTION

Accordingly, it is an object of the invention to provide a voltage-controlled oscillator in which the temporal fluctuation of a output clock, i.e., jitter can substantially be reduced even if the characteristics in the amplifier element or the like which comprises the voltage-controlled oscillator is dispersed.

According to the invention, a voltage-controlled oscillator, comprises:

a voltage-controlled variable delay unit D(N) which comprises first amplifier elements AP1(1), AP1(2), ..., AP1(N) of number N in which a pair of input signal lines and a pair of output signal lines are connected with each other, wherein the voltage-controlled delay unit can control a delay time for transmitting a signal from a pair of reference input signal lines to a pair of reference output signal lines; and ring oscillators P(N) of number Q of one or more which comprises second amplifier elements AM(1), AM(2), ..., AM(M) of number M in which phase correctors M(1), M(2), ..., M(M) of number M are connected to the respective pair of output signal lines from first amplifier elements AP2(1), AP2(2), ..., AP2(M) of number M, wherein an end pair of input signal lines and an end pair of output signal lines are connected with each other in the form of a ring;

wherein the pair of output signal lines of each of the first amplifier elements AP1(1), AP1(2), ..., AP1(N) is connected to a first pair of input terminals and second pair of input terminals of each of the phase correctors M(1), M(2), ..., M(M) included in the ring oscillator P(N), followed by procedures that, between the ring oscillators, P(N/2), P(N/4), ..., P(N/(2×Q)), of number Q, a pair of output signal lines of each of the phase correctors M(1), M(2) ..., M(N/(2×X)) included in a ring oscillator P(N/(2×X)) is connected to a first pair of input terminals and second pair of input terminals of each of the phase correctors M(1), M(2), ..., M(N/(4×X)) included in a ring oscillator P(N/(4×X)), wherein X is in the range of 1 to Q−1.

According to another aspect of the invention, a phase-locked loop circuit, comprises:

a phase comparator which inputs a first and second input signals and outputs a third control signal corresponding to a phase difference or frequency difference through one or more signal lines;

a charge pump circuit which inputs the third control signal and outputs a fourth control signal;

a low-pass filter circuit which inputs the fourth control signal and outputs a signal obtained by attenuating a high-frequency component of the fourth control signal; and the above-mentioned voltage-controlled oscillator which inputs the output signal from the low-pass filter circuit as a control signal;

wherein a reference clock from outside is given to the voltage-controlled oscillator through a pair of reference input signal lines and is given to the phase comparator as the first input signal, and the second input signal is given to the phase comparator through a pair of reference output signal lines from the voltage-controlled oscillator.

The voltage-controlled oscillator according to the invention utilizes that the oscillation frequency in the ring oscillator becomes twice when the number of the amplifier elements forming the ring oscillator is halved. For example, there is provided the ring oscillator comprising four amplifier elements connected in the form of a ring, and the ring oscillator comprising two amplifier elements connected in the form of a ring, to the voltage-controlled variable delay unit comprising eight amplifier elements connected in series. The respective amplifier elements have commonly the control signal line to have the same delay time. When the phase difference between the reference input signal and the reference output signal in the voltage-controlled variable delay unit is 180 degrees and the frequency thereof is f, the oscillation frequency in the ring oscillator comprising four amplifier elements becomes 2×f, and the oscillation frequency in the ring oscillator comprising two amplifier elements becomes 4×f. However, if leaving as it is, the phase difference between the reference input signal and the above quadrupled signal will be instable. According to the invention, the phase correctors are utilized to stabilize the phase difference between the voltage-controlled variable delay unit and the ring oscillator comprising four amplifier elements and the phase difference between the ring oscillator comprising four amplifier elements and the ring oscillator comprising two amplifier elements.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a voltage-controlled oscillator in the preferred embodiment, the aforementioned conventional voltage-controlled oscillator will be explained in FIGS. 1 to 3.

Figure 1:
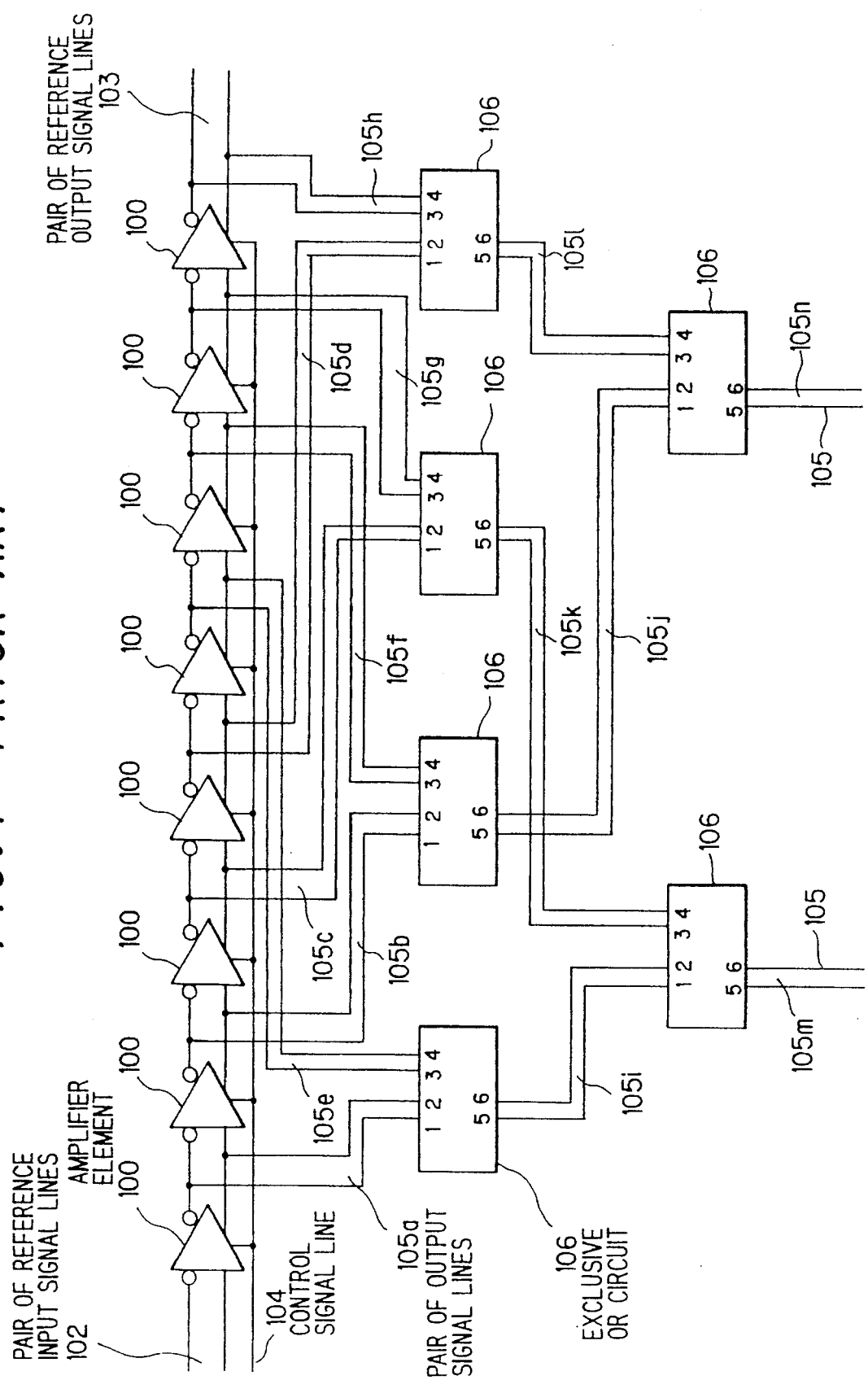
FIG. 1 is a block diagram showing a conventional voltage-controlled oscillator.

As shown in FIG. 1, the conventional voltage-controlled oscillator comprises: voltage-controlled variable delay unit which can control the delay time for which a differential signal is transmitted from a pair of reference input signal lines to a pair of reference output signal lines by a control signal, the voltage-controlled variable delay unit comprising a plurality of amplifier elements (eight amplifier elements in FIG. 1) 100 with which a pair of input signal lines, a pair of output signal lines and one or more control signal line are provided, the plurality of amplifier elements are linearly connected to connect the pair of input signal lines and the pair of output signal lines; and exclusive OR circuits 106 to obtain a doubled signal by utilizing a phase difference of signals obtained from the respective pair of output signal lines from the voltage-controlled variable delay units, wherein the voltage-controlled variable delay units and the exclusive OR circuits are connected in the form of pyramid by means of the pairs of output signal lines 105a, 105b, 105c, 105d, 105e, 105f, 105g, 105h, 105i, 105j, 105k, 105l, 105m and 105n.

Figure 2:
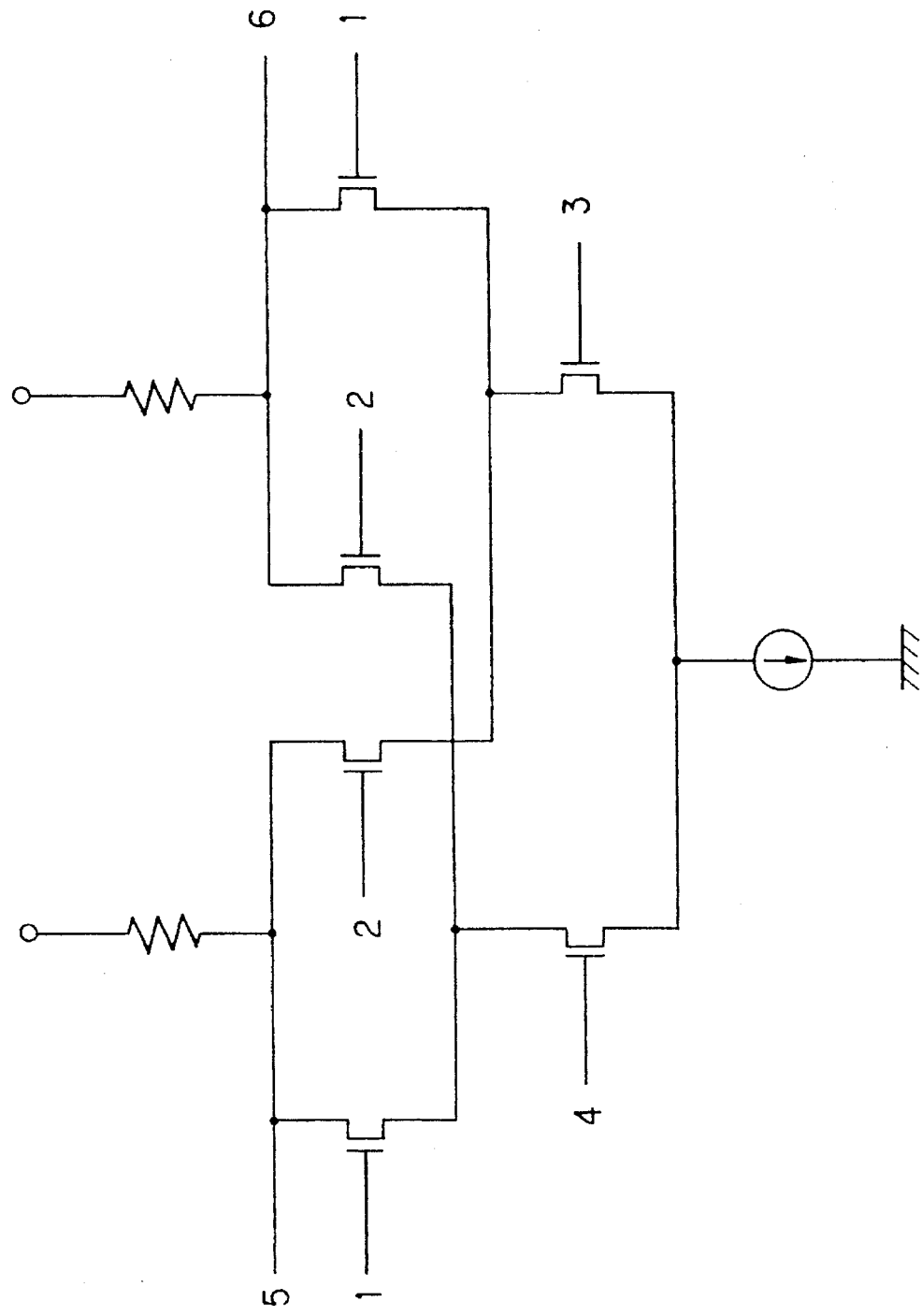
FIG. 2 is a circuit diagram showing an example of an exclusive OR circuit used in the conventional voltage-controlled oscillator.
Figure 3:
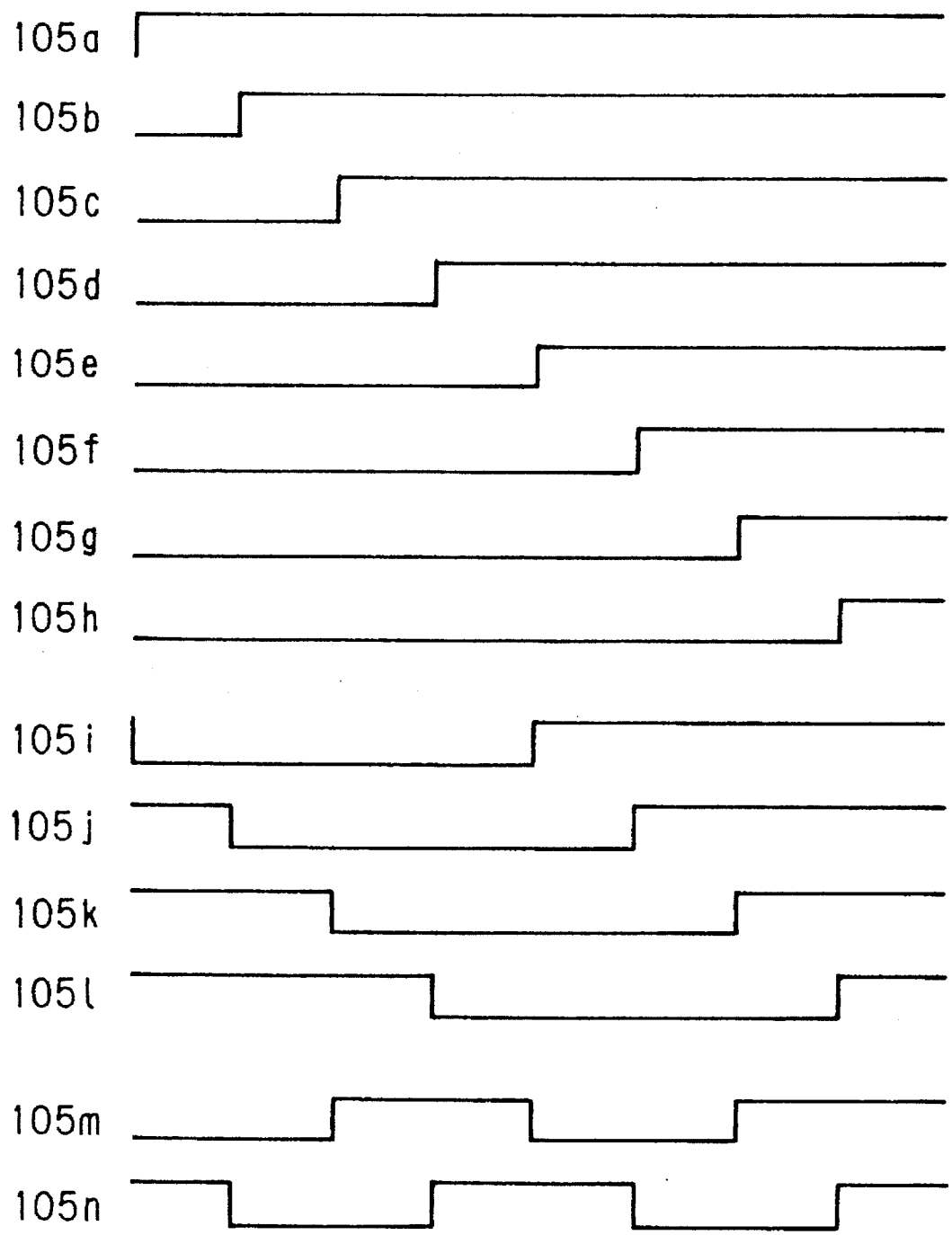
FIG. 3 is a timing chart showing the respective input and output signals in the voltage-controlled oscillator in FIG. 1

An example of the formation of the exclusive OR circuit 106 is shown in FIG. 2. The pair of terminals 1, 2, 3, 4, 5 and 6 of the exclusive OR circuit are connected to the pair of output signal lines as shown in FIG. 1. The respective input signals of the exclusive OR circuit is shown in FIG. 3.

In the above voltage-controlled oscillator, when the control signal line 104 is controlled such that the phase difference between the periodic signal inputted to the pair of reference input signal lines 102 and the periodic signal outputted from the pair of reference output signal lines 103 is 180 degrees, the periodic signal with a quadrupled frequency of 4×f(if the frequency of the periodic signal is f) is obtained from the pair of output signal lines 105.

Hereon, since the dispersion in the quality of the amplifier element 100 or exclusive OR circuit 106 directly affects the jitter in the doubled signal obtained from the pair of output signal lines 105, the doubled or quadrupled signal therefrom trends to include a considerable jitter.

Next, a voltage-controlled oscillator in the preferred embodiment will be explained in FIG. 4, wherein like parts are indicated by like reference numerals as used in FIG. 1. The voltage-controlled oscillator comprises a plurality of first amplifier elements 100 and a plurality of phase correctors 101. Each of the first amplifier element 100 is provided with a pair of input signal lines, a pair of output signal lines and one or more control signal line and can function as a differential amplifier and control the delay time for which a differential signal is transmitted from the pair of input signal lines to the pair of output signal lines by the control signal of the control signal line.

Each of the phase correctors 101 is provided with a pair of input signal lines, a pair of output signal lines, a first pair of input terminals and a second pair of input terminals. Furthermore, it is provided with a switching element configured by a MOS transistor or bipolar transistor which is shut or opened such that the pair of input signal lines and the pair of output signal lines have a given logical level when the first pair of input terminals and second pair of input terminals have a different logical level each other, and which is shut or opened such that the pair of input signal lines and the pair of output signal lines have a logical level reversed to the given logical level when the first pair of input terminals and second pair of input terminals have the same logical level.

Figure 4:
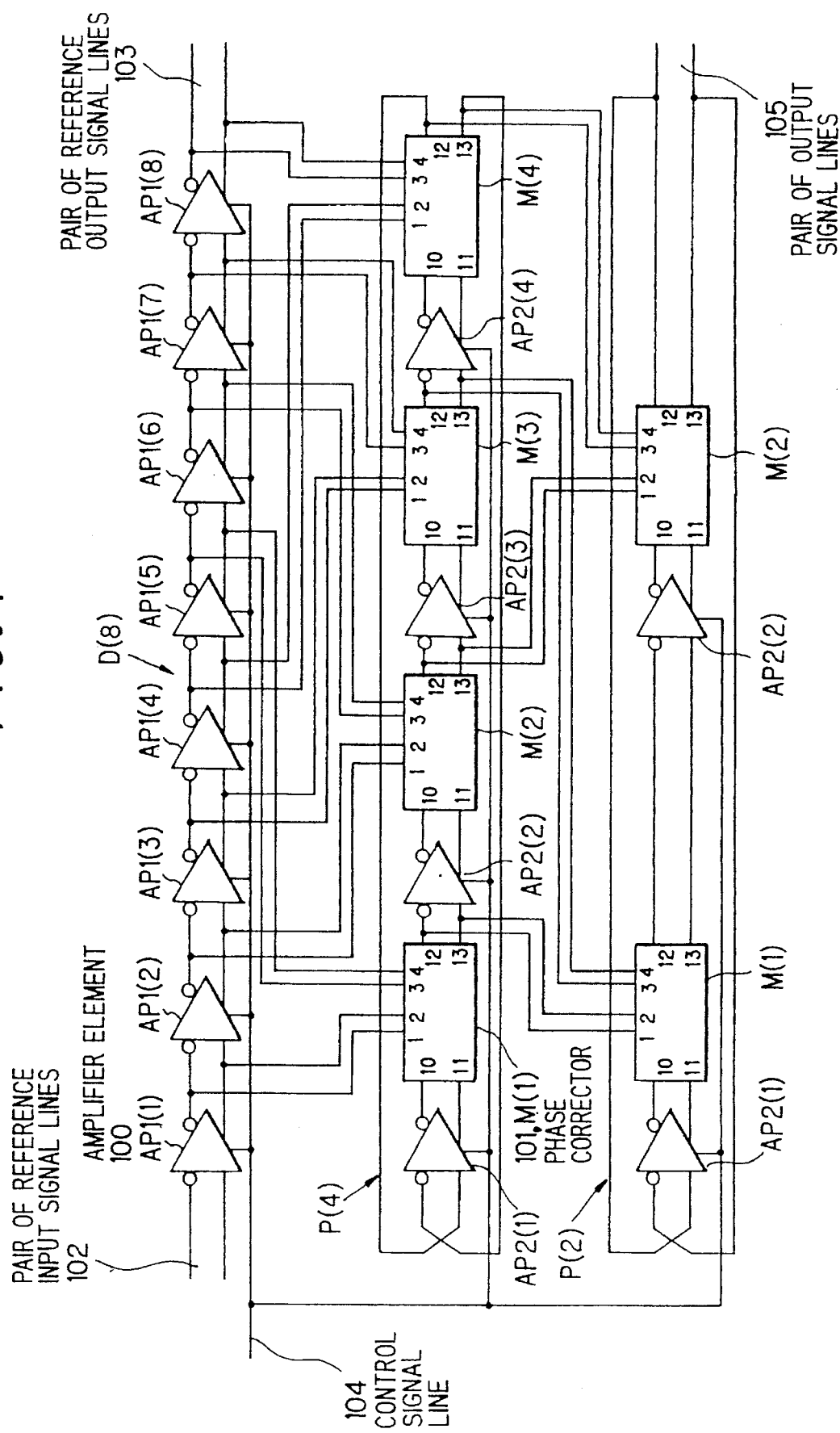
FIG. 4 is a block diagram showing a voltage-controlled oscillator in a preferred embodiment according to the invention.

In further detail, as shown in FIG. 4, the voltage-controlled oscillator comprises: a voltage-controlled variable delay unit D(8) which comprises eight first amplifier elements AP1(1), AP1(2), ..., AP1(8) and in which the pair of input signal lines and pair of output signal lines are linearly connected; a ring oscillator P(4) which comprises four second amplifier elements AM(1), AM(2), ..., AM(4) in which phase correctors M(1), M(2), ..., M(4) are connected to the respective pair of output signal lines from the four first amplifier elements AP2(1), AP2(2), ..., AP2(4), the pair of input signal lines and pair of output signal lines being connected in the form of a ring; and a ring oscillator P(2) which comprises two second amplifier elements AM(1) and AM(2) in which phase correctors M(1) and M(2) are connected to the respective pair of output signal lines from the two second amplifier elements AP2(1) and AP2(2), the pair of input signal lines and pair of output signal lines being connected in the form of a ring. The pairs of output signal lines of the amplifier elements AP1(1), AP1(2), ..., AP1(8) are connected to a first pair of input terminals and second pair of input terminals of the respective phase correctors M(1), M(2), ..., M(4) in the ring oscillator P(4), and the pairs of output signal lines of the phase correctors M(1), M(2), ..., M(4) in the ring oscillator P(4) are connected to a first pair of input terminals and second pair of input terminals of the respective phase correctors M(1) and M(2) in the ring oscillator P(2).

Figure 5:
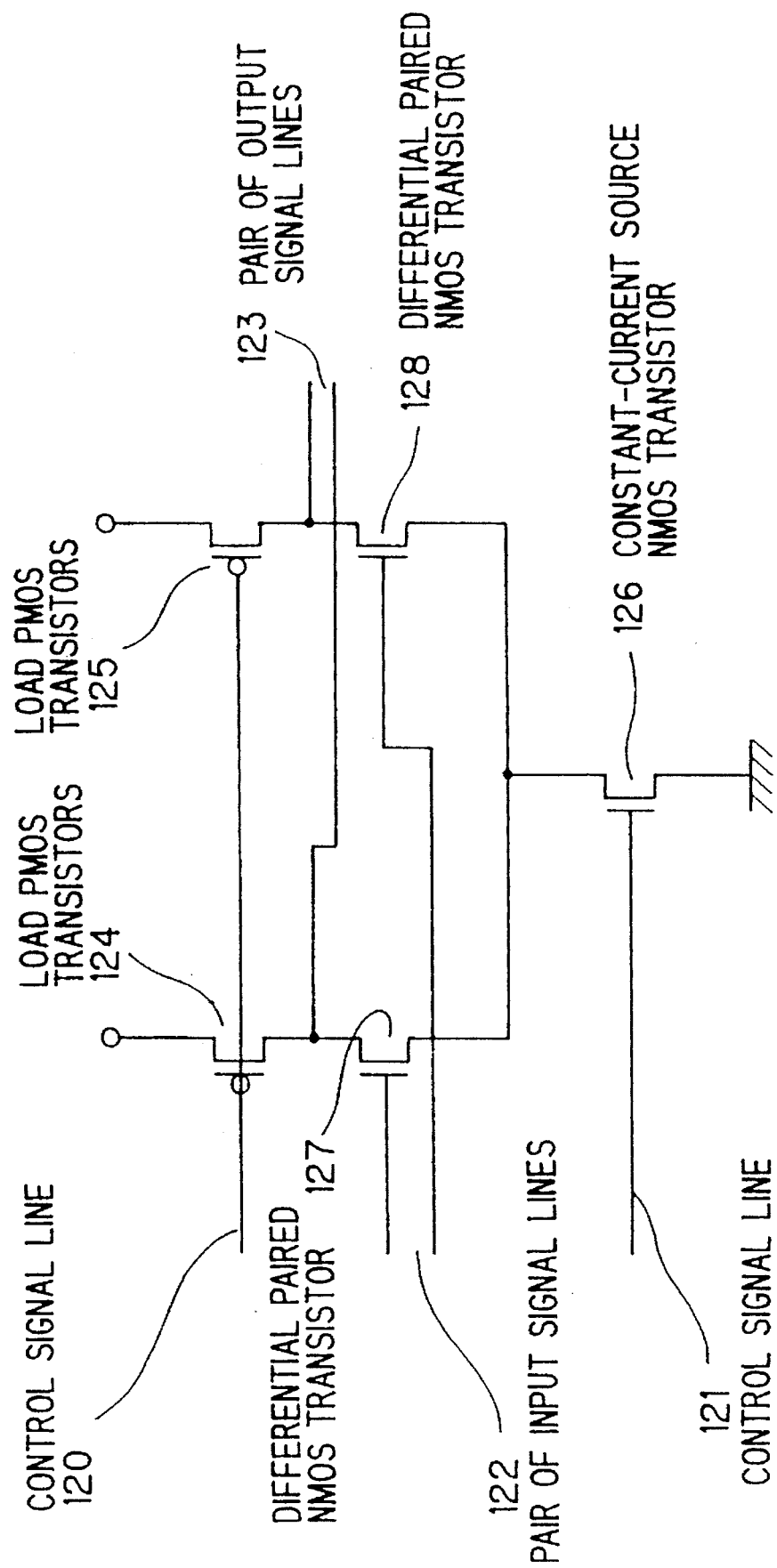
FIG. 5 is a circuit diagram showing an example of an amplifier element used in the voltage-controlled amplifier in FIG. 4.

FIG. 5 shows an example of the configuration of the amplifier element 100 used in the preferred embodiment of the voltage-controlled oscillator of the invention. The amplifier element 100 comprises two control signal lines 120 and 121, a pair of input signal lines 122, a pair of output signal lines 123, p-MOS transistors 124 and 125 controlled by the control signal line 120, a constant-current source n-MOS transistor 126 controlled by the control signal line 121, and a differential pair of n-MOS transistors 127 and 128 controlled by the pair of input signal lines 122. By increasing the voltage applied on the control signal line 121, the delay time between the input and the output of this amplifier element can be decreased. At this time, though the driving current is increased, the amplitude of the signal obtained from the pair of output signal lines 123 can be kept constant by decreasing the voltage applied on the control signal line 120. The amplifier element 100 is not limited to this example.

Figure 6:
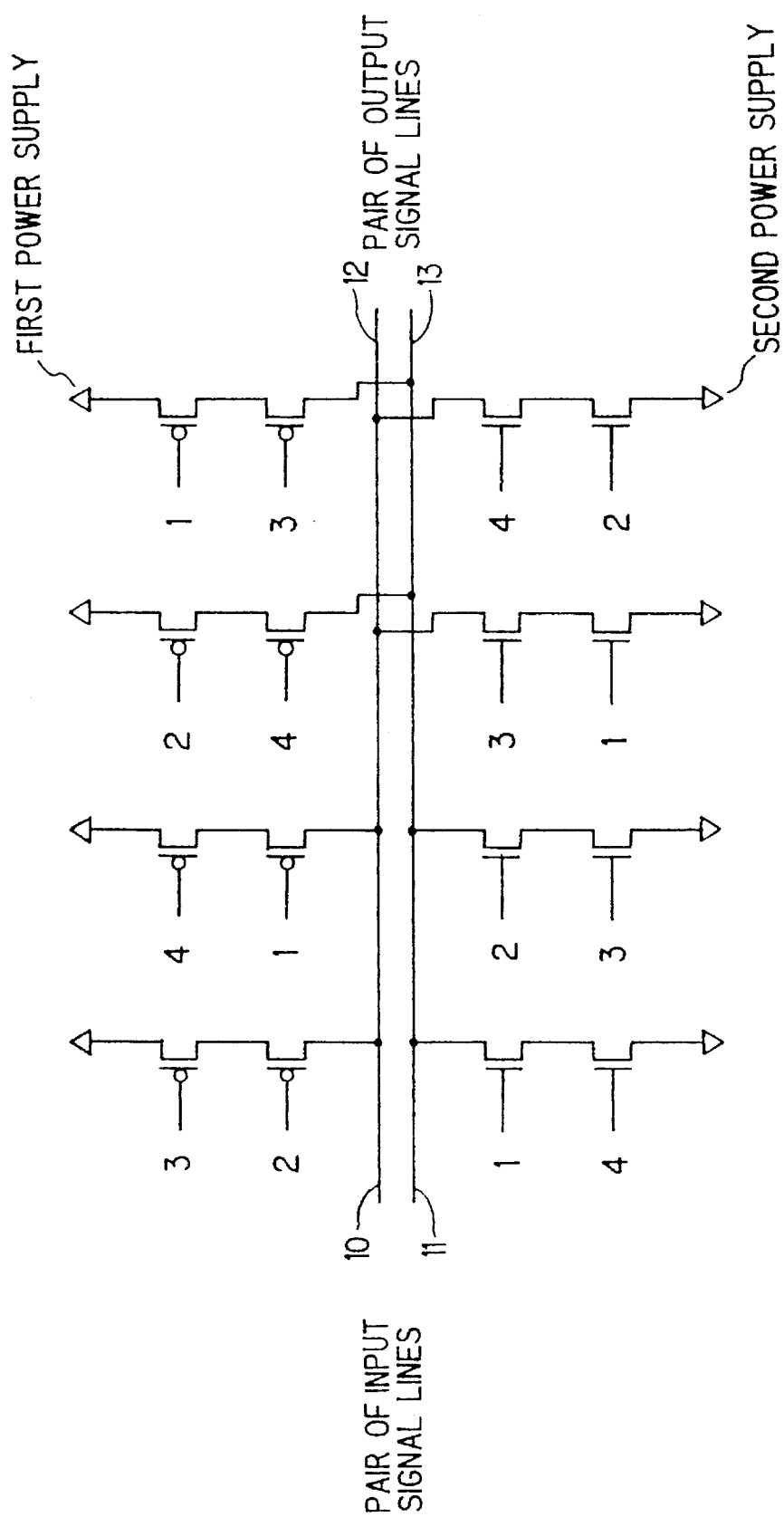
FIG. 6 is a circuit diagram showing an example of a phase corrector used in the voltage-controlled oscillator in FIG. 4.

FIG. 6 shows an example of the configuration of the phase corrector 101 used in the preferred embodiment of the invention. The phase corrector 101 comprises a pair of input signal lines 10 and 11, a pair of output signal lines 12 and 13, a first pair of input terminals 1 and 2, and a second pair of input terminals 3 and 4. The input signal line 10 and output signal line 12, and the input signal line 11 and output signal line 13 are commonly used, respectively. When the signals 2 and 3 are on low level and the signals 1 and 4 are on low level, the signal lines 10 and 12 are connected to a first power supply. When the signals 1 and 3 are on high level and the signals 2 and 4 are on high level, the signal lines 10 and 12 are connected to a second power supply. On the other hand, when the signals 2 and 4 are on low level and the signals 1 and 3 are on low level, the signal lines 11 and 13 are connected to a first power supply. When the signals 1 and 4 are on high level and the signals 2 and 3 are on high level, the signal lines 11 and 13 are connected to a second power supply. Herein, the first power supply has a potential indicating the high level in the amplifier element 100, and the second power supply has a potential indicating the low level in the amplifier element 100. The phase corrector 101 is not limited to this example.

The reference numerals 10, 11, 12 and 13 for indicating the signal lines and reference numerals 1, 2, 3 and 4 for indicating the signals in FIG. 6 are also provided with the respective blocks of the phase correctors 101 in FIG. 4. Therefore, the connection therebetween can be understood with reference to FIG. 4.

The voltage-controlled oscillator according to the invention utilizes that the oscillation frequency in the ring oscillator becomes twice when the number of the amplifier elements forming the ring oscillator is halved. For example, in the circuit shown in FIG. 4, there is provided the ring oscillator comprising four amplifier elements connected in the form of a ring, and the ring oscillator comprising two amplifier elements connected in the form of a ring, to the voltage-controlled variable delay unit comprising eight amplifier elements connected in series. The respective amplifier elements have commonly the control signal line 104 to have the same delay time. When the phase difference between the reference input signal and the reference output signal in the voltage-controlled variable delay unit is 180 degrees and the frequency thereof is f, the oscillation frequency in the ring oscillator comprising four amplifier elements becomes 2×f, and the oscillation frequency in the ring oscillator comprising two amplifier elements becomes 4×f. However, if leaving as it is, the phase difference between the reference input signal and the above quadrupled signal will be instable. According to the invention, the phase correctors 101 are utilized to stabilize the phase difference between the voltage-controlled variable delay unit and the ring oscillator comprising four amplifier elements and the phase difference between the ring oscillator comprising four amplifier elements and the ring oscillator comprising two amplifier elements.

According to the voltage-controlled oscillator of the invention, even if the characteristics in the amplifier element or the like which comprises the voltage-controlled oscillator is dispersed, the temporal fluctuation of a output clock, i.e., jitter can substantially be reduced since the clock signal is basically obtained from the ring oscillator.

The phase-locked loop circuit according to the invention will be explained below with reference to FIGS. 7 to 10.

Figure 7:
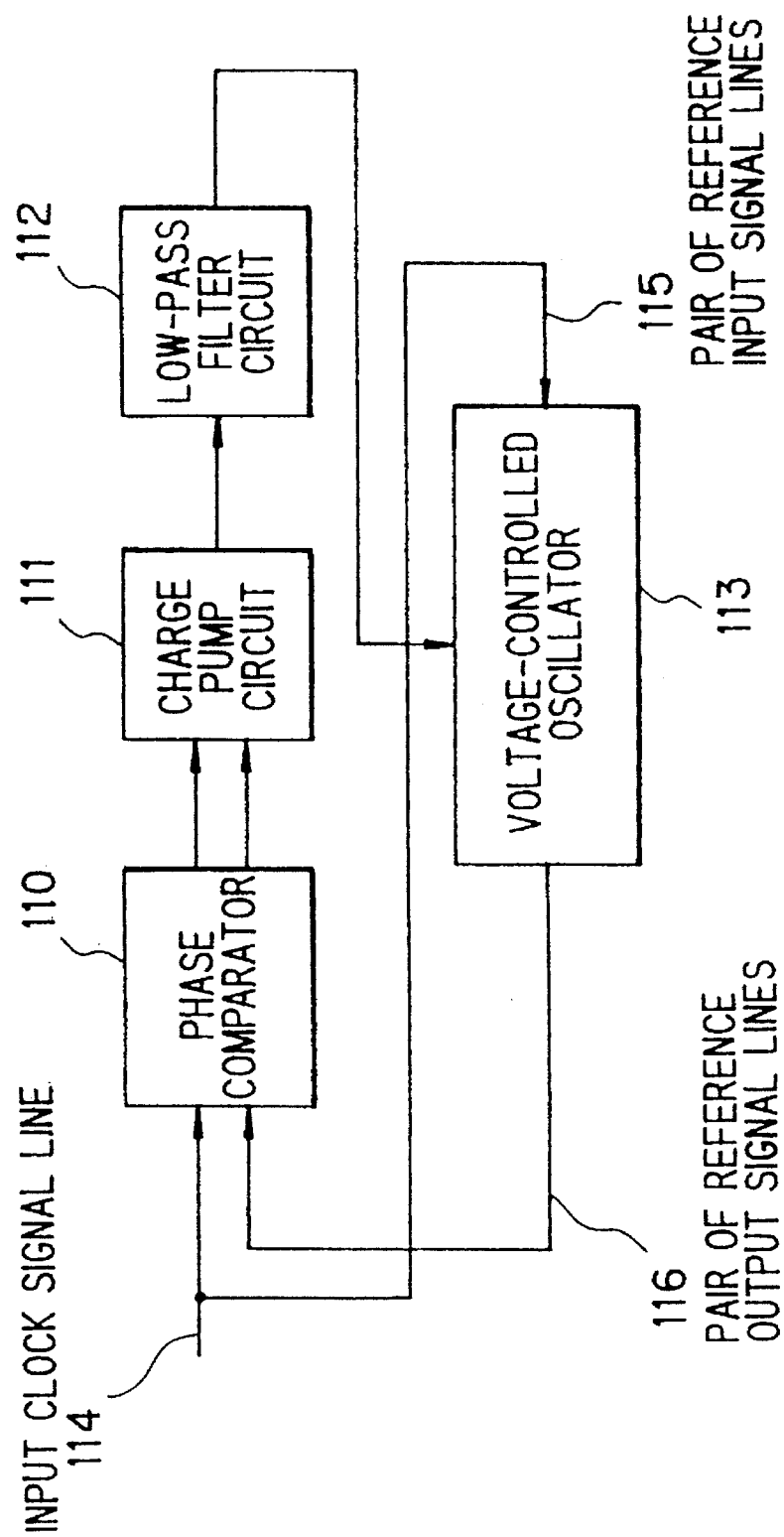
FIG. 7 is a block diagram showing a phase-locked loop circuit in a preferred embodiment according to the invention.

FIG. 7 is a block diagram showing a phase-locked loop circuit in the preferred embodiment. The phase-locked loop circuit comprises: a phase comparator 110 which inputs a first and second input signals and outputs a third control signal corresponding to the phase difference or frequency difference through one or more signal lines; a charge pump circuit 111 which inputs the third control signal and outputs a fourth control signal; a low-pass filter circuit 112 which inputs the fourth control signal and outputs a signal obtained by attenuating the high-frequency component of the fourth control signal; and a voltage-controlled oscillator 113 which input the output signal from the low-pass filter circuit 112 as a control signal; wherein a reference clock is given to the voltage-controlled oscillator 113 through an input clock signal line 114 and a pair of reference input signal lines 115 and is given to the phase comparator 110 as the first input signal, and the second input signal to the phase comparator 110 is given through a pair of reference output signal lines 116 from the voltage-controlled oscillator 113.

Figure 8:
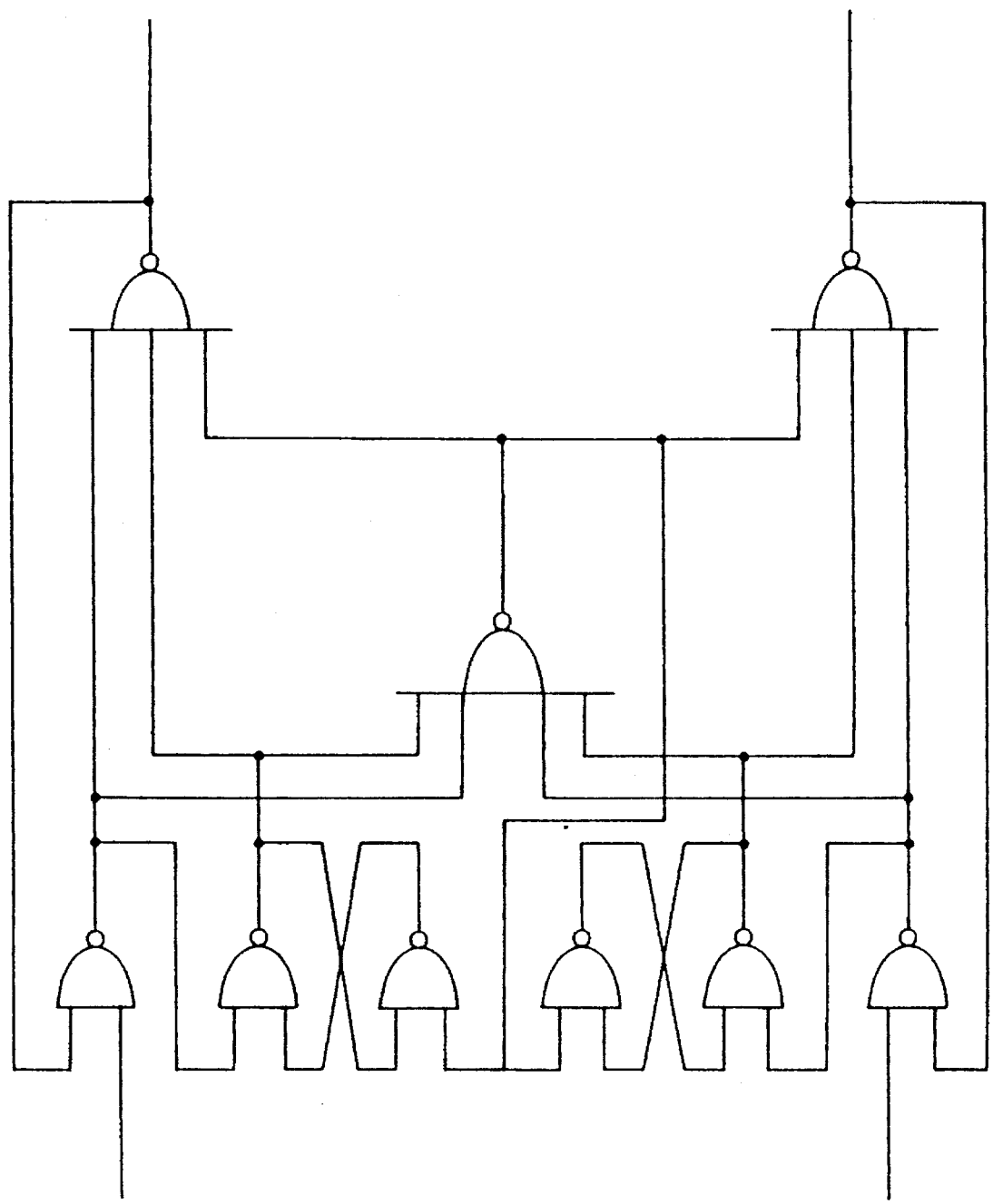
FIG. 8 is a circuit diagram showing an example of a phase comparator used in the phase-locked loop circuit in FIG. 7.

FIG. 8 shows an example of the phase comparator 110 used in the phase-locked loop circuit in the above embodiment. As shown in FIG. 8, the phase comparator comprises a plurality of NAND circuits.

Figure 9:
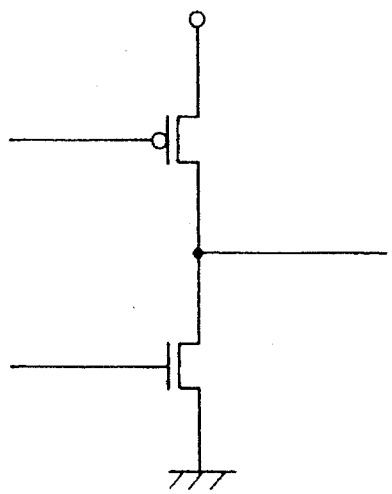
FIG. 9 is a circuit diagram showing an example of a charge pump circuit used in the phase-locked loop circuit in FIG. 7.

FIG. 9 shows an example of the charge pump circuit 111 used in the phase-locked loop circuit in the above embodiment. The charge pump circuit comprises a p-MOS transistor and n-MOS transistor.

Figure 10:
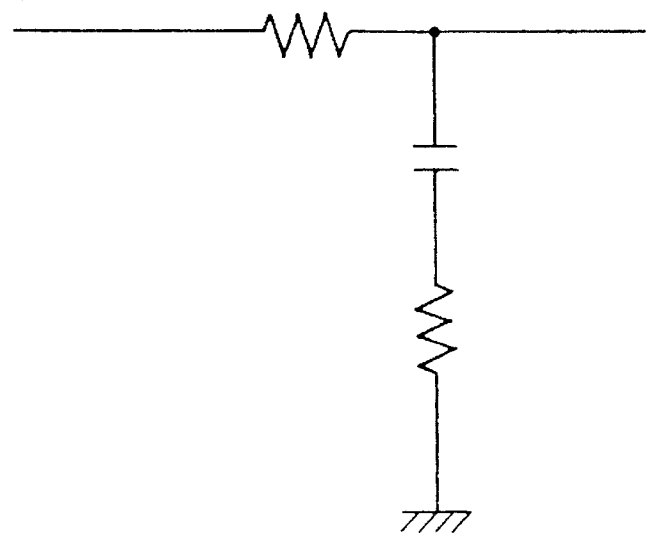
FIG. 10 is a circuit diagram showing an example of a low-pass filter circuit used in the phase-locked loop circuit in FIG. 7.

FIG. 10 shows an example of the low-pass filter circuit 112 used in the phase-locked loop circuit in the above embodiment. The low-pass filter circuit comprises two resistors and one capacitor.

In the above phase-locked loop circuit, when the system is in a stable state, the time for transmitting a signal from the pair of reference input signal lines 115 to the pair of reference output signal lines 116 is determined such that the phase difference between the signal passing the input clock signal line 114 and the signal passing the pair of reference input signal lines 116 becomes 180 degrees.

The phase-locked loop circuit in the embodiment can be in a stable state only by coinciding the phase since the frequencies of the signal passing the pair of reference output signal lines 116 and the signal passing the input clock signal line 114 coincide with each other. Hereon, the voltage-controlled oscillator according to the invention can be applied as the voltage-controlled oscillator 113 in the above phase-locked loop circuit to obtain a clock signal with low jitter while having a doubled frequency from an inputted clock signal.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A voltage-controlled oscillator, comprising:

a voltage controlled variable delay unit D(N) which comprises first amplifier elements AP1(1), AP1(2), . . .

, AP1(N) of number N in which a pair of input signal lines and a pair of output signal lines are connected with each other, wherein said voltage-controlled delay unit can control a delay time for transmitting a signal from a pair of reference input signal lines to a pair of reference output signal lines; and ring oscillators P(N) of number Q of one or more which comprises second amplifier elements AM(1), AM(2), ..., AM(M) of number M in which phase correctors M(1), M(2), ..., M(M) of number M are connected to the respective pair of output signal lines from first amplifier elements AP2(1), AP2(2), ..., AP2(M) of number M, wherein an end pair of input signal lines and an end pair of output signal lines are connected with each other in the form of ring;

wherein said pair of output signal lines of each of said first amplifier elements AP1(1), AP1(2), ..., AP1(N) is connected to a first pair of input terminals and second pair of input terminals of each of said phase correctors M(1), M(2), ..., M(M) included in said ring oscillator P(N), followed by procedures that, between said ring oscillators, P(N/2), P(N/4), ..., P(N/(2×Q)), of number Q, a pair of output signal lines of each of said phase correctors M(1), M(2) ..., M(N/(2×X)) included in a ring oscillator P(N/(2×X)) is connected to a first pair of input terminals and second pair of input terminals of each of said phase correctors M(1), M(2), ..., M(N/(4×X)) included in a ring oscillator P(N/(4×X)), wherein X is in the range of 1 to Q–1.

2. A voltage-controlled oscillator, according to claim 1, wherein:

each of said first amplifier elements is provided with a pair of input signal lines, a pair of output signal lines and one or more control signal line and can function as differential amplifier and control a delay time on which a differential signal is transmitted from said pair of input signal lines to said pair of output signal lines by a control signal through said control signal line.

3. A voltage-controlled oscillator, according to claim 1, wherein:

each of said phase correctors is provided with a pair of input signal lines, a pair of output signal lines, a first pair of input terminals, a second pair of input terminals, a switching element which is shut or opened such that said pair of input signal lines and pair of output signal lines have a given logical level when said first pair of input terminals and second pair of input terminals have a different logical level each other, and which is shut or opened such that said pair of input signal lines and pair of output signal lines have a logical level reversed to said given logical level when said first pair of input terminals and second pair of input terminals have the same logical level.

4. A voltage-controlled oscillator, according to claim 3, wherein:

said switching element comprises a MOS transistor or bipolar transistor.

5. A phase-locked loop circuit, comprising:

a phase comparator which inputs a first and second input signals and outputs a third control signal corresponding to a phase difference through one or more signal lines;

a charge pump circuit which inputs said third control signal and outputs a fourth control signal;

a low-pass filter circuit which inputs said fourth control signal and outputs a signal obtained by attenuating a high-frequency component of said fourth control signal; and a voltage-controlled oscillator which inputs said output signal from said low-pass filter circuit as a control signal;

said voltage-controlled oscillator comprising a voltage-controlled variable delay unit D(N) which comprises first amplifier elements AP1(1), AP1(2), ..., AP1(N) of number N in which a pair of input signal lines and a pair of output signal lines are connected with each other, wherein said voltage-controlled delay unit can control a delay time for transmitting a signal from a pair of reference input signal lines to a pair of reference output signal lines; and ring oscillators P(N) of number Q of one or more which comprises second amplifier elements AM(1), AM(2), ..., AM(M) of number M in which phase correctors M(1), M(2), ..., M(M) of number M are connected to the respective pair of output signal lines from first amplifier elements AP2(1), AP2(2), ..., AP2(M) of number M, wherein an end pair of input signal lines and an end pair of output signal lines are connected with each other in the form of a ring;

wherein said pair of output signal lines of each of said first amplifier elements AP1(1), AP1(2), ..., AP1(N) is connected to a first pair of input terminals and second pair of input terminals of each of said phase correctors M(1), M(2), ..., M(M) included in said ring oscillator P(N), followed by procedures that, between said ring oscillators, P(N/2), P(N/4), ..., P(N/(2×Q)), of number Q, a pair of output signal lines of each of said phase correctors M(1), M(2) ..., M(N/(2×X)) included in a ring oscillator P(N/(2×X)) is connected to a first pair of input terminals and second pair of input terminals of each of said phase correctors M(1), M(2), ..., M(N/(4×X)) included in a ring oscillator P(N/(4×X)), wherein X is in the range of 1 to Q–1, and wherein a reference clock from outside is given to said voltage-controlled oscillator through a pair of reference input signal lines and is given to said phase comparator as said first input signal, and said second input signal is given to said phase comparator through a pair of reference output signal lines from said voltage-controlled oscillator.

6. A phase-locked loop circuit, according to claim 5, wherein:

each of said first amplifier elements is provided with a pair of input signal lines, a pair of output signal lines and one or more control signal line and can function as differential amplifier and control a delay time on which a differential signal is transmitted from said pair of input signal lines to said pair of output signal lines by a control signal through said control signal line.

7. A phase-locked loop circuit, according to claim 5, wherein:

each of said phase correctors is provided with a pair of input signal lines, a pair of output signal lines, a first pair of input terminals, a second pair of input terminals, a switching element which is shut or opened such that said pair of input signal lines and pair of output signal lines have a given logical level when said first pair of input terminals and second pair of input terminals have a different logical level each other, and which is shut or opened such that said pair of input signal lines and pair of output signal lines have a logical level reversed to said given logical level when said first pair of input terminals and second pair of input terminals have the same logical level.

8. A phase-locked loop circuit, according to claim 7, wherein:

said switching element comprises a MOS transistor or bipolar transistor.

* * * * *